(12) United States Patent
Colgan et al.

(10) Patent No.: US 10,003,018 B1
(45) Date of Patent: Jun. 19, 2018

(54) VERTICAL MULTI-BATCH MAGNETIC ANNEALING SYSTEMS FOR REDUCED FOOTPRINT MANUFACTURING ENVIRONMENTS

(71) Applicant: Tokyo Electron Limited, Minato-ku, Tokyo (JP)

(72) Inventors: Ian Colgan, Ballivor (IE); Ioan Domsa, Dublin (IE); George Eyres, Dublin (IE); Saito Makoto, Dublin (IE); Noel O'Shaughnessy, Dublin (IE); Toru Ishii, Dublin (IE); David Hurley, Dublin (IE)

(73) Assignee: Tokyo Electron Limited, Tokyo (JP)

( * ) Notice: Subject to any disclaimer, the term of this patent is extended or adjusted under 35 U.S.C. 154(b) by 0 days. days.

(21) Appl. No.: 15/589,613

(22) Filed: May 8, 2017

(51) Int. Cl.
| | |
|---|---|
| H01L 21/00 | (2006.01) |
| H01L 43/12 | (2006.01) |
| H01L 27/22 | (2006.01) |
| C21D 9/00 | (2006.01) |
| H01L 21/477 | (2006.01) |
| C21D 1/42 | (2006.01) |
| C21D 1/54 | (2006.01) |
| G11C 11/16 | (2006.01) |

(52) U.S. Cl.
CPC .............. *H01L 43/12* (2013.01); *C21D 1/42* (2013.01); *C21D 1/54* (2013.01); *C21D 9/0018* (2013.01); *G11C 11/16* (2013.01); *H01L 21/477* (2013.01); *H01L 27/222* (2013.01)

(58) Field of Classification Search
CPC .......... C21D 1/42; C21D 1/54; C21D 9/0018; H01L 27/222; H01L 21/477; H01L 43/12; G11C 11/16
See application file for complete search history.

(56) References Cited

U.S. PATENT DOCUMENTS

| | | | |
|---|---|---|---|
| 6,303,908 B1 | 10/2001 | Yamaga et al. | |
| 6,419,985 B1 * | 7/2002 | Ishizuka | B05D 1/62 |
| | | | 257/E21.242 |
| 6,833,107 B2 | 12/2004 | Kuriyama et al. | |
| 9,410,742 B2 | 8/2016 | Colgan et al. | |
| 2002/0048509 A1 | 4/2002 | Sakata et al. | |
| 2004/0018650 A1 | 1/2004 | Sasajima et al. | |
| 2004/0259276 A1 * | 12/2004 | Yue | H01J 37/32935 |
| | | | 438/5 |
| 2008/0210168 A1 | 9/2008 | Su et al. | |

* cited by examiner

Primary Examiner — (Vikki) Hoa B Trinh

(57) ABSTRACT

Embodiments are described for annealing systems and related methods to process microelectronic workpieces using vertical multi-batch perpendicular magnetic annealing systems that allow for a side-by-side configuration of multiple annealing systems to satisfy reduced footprint requirements.

30 Claims, 8 Drawing Sheets

VERTICAL MULTI-BATCH MAGNETIC ANNEALING SYSTEMS FOR REDUCED FOOTPRINT MANUFACTURING ENVIRONMENTS

BACKGROUND

The present disclosure relates to annealing systems and methods for processing microelectronic workpieces, and in particular, systems and methods for annealing one or more layers containing magnetic material on microelectronic workpieces.

Semiconductor device formation involves a series of manufacturing techniques related to the formation, patterning and removal of a number of layers of material on a substrate. Magnetic annealing is one of three processes required to manufacture magnetoresistive random access memory (MRAM) devices compatible with conventional complementary metal oxide semiconductor (CMOS) logic based microelectronic workpieces. To successfully anneal a workpiece, the ferromagnetic layer must be held at a predetermined temperature in a magnetic field for a period of time long enough for the crystals to orient themselves in a common direction upon cooling. This process, which is also referred to as "soak" is carried out in an inert, reducing, or vacuum environment to prevent oxidation of the workpieces, while they are held at the predetermined temperature.

Magnetic annealing equipment generally operates in batch-mode, i.e., plural workpieces are annealed at the same time, and performs a sequence of steps. As an example, these steps include heating, soaking, and cooling the workpieces in the presence of a magnetic field, typically between 0.02 and 7.0 T (Tesla). The cost of MRAM device manufacturing is linked to the magnetic annealing tools, where the productivity (acceptable devices produced per hour) is the product of density (number of devices per workpiece), throughput (workpieces per hour), and yield (ratio of acceptable devices to total number of devices processed), as dictated by the overall thermal/anneal cycle.

Conventionally, magnetic annealing systems for in-plane and out-of-plane magnet orientation are of either a horizontal or vertical orientation. And, with manufacturing facility floor-space being a premium, tool footprint and workpiece throughput, as mentioned above, are critical for successful implementation.

SUMMARY

Embodiments are described for annealing systems and methods to process microelectronic workpieces using vertical multi-batch perpendicular magnetic annealing systems that allow for a side-by-side configuration of multiple annealing systems to satisfy reduced footprint requirements.

For one embodiment, a manufacturing system to anneal multiple batches of workpieces is disclosed including a first annealing system positioned on a fabrication floor and a second annealing system positioned on the fabrication floor. The first annealing system includes a vertical furnace having a processing space, a workpiece boat to carry at least one hundred workpieces, a boat loader arranged beneath the vertical furnace and configured to vertically translate the workpiece boat and position the workpieces within the processing space, and a magnet positioned outside the vertical furnace and configured to generate a magnetic field within the processing space. The second annealing system includes a vertical furnace having a processing space, a workpiece boat to carry at least one hundred workpieces, a boat loader arranged beneath the vertical furnace and configured to vertically translate the workpiece boat and position the workpieces within the processing space, and a magnet positioned outside the vertical furnace and configured to generate a magnetic field within the processing space. Further for the manufacturing system, the first and second annealing systems are positioned on the fabrication floor to have a combined footprint of less than 9.5 $m^2$ (square meters).

In additional embodiments, the magnet for the first annealing system and the magnet for the second annealing system each includes a vertical passive magnet. In further embodiments, the first and second annealing systems are further configured to have a combined vertical footprint less than a height limit of between 3.5 meters to 4.2 meters.

In additional embodiments, the magnet for the first annealing system and the magnet for the second annealing system each has a magnetic field that decreases to 5-Gauss within a distance (X) from a middle vertical axis of the magnet where 0.4 meters≤X≤1.1 meters. In further embodiments, the magnet for the first annealing system and the magnet for the second annealing system each provides a magnetic field up to a level (M) within the processing space for each annealing system where M≥1 Tesla. In still further embodiments, a 5-Gauss field line associated with the second annealing system either does not overlap with a 5-Gauss field line associated with the first annealing system or overlaps with the 5-Gauss field line associated with the first annealing system by less than or equal to 10 percent of the distance (X). In additional further embodiments, a 5-Gauss field line associated with the second annealing system either does not overlap with a 5-Gauss field line associated with the first annealing system or overlaps with the 5-Gauss field line associated with the first annealing system by less than or equal to 0.2 percent of the distance (X).

In additional embodiments, the first and second annealing systems are positioned in an offset, side-by-side arrangement. In further embodiments, the manufacturing system further includes a first set of electrical, gas, and water systems located adjacent the first annealing system and includes a second set of electrical, gas, and water systems located adjacent the second annealing system. In still further embodiments, the manufacturing system includes a first service area located adjacent a first edge of the first and second annealing systems for access to the first annealing system and includes a second service area located adjacent a second edge of the first and second annealing systems for access to the second annealing system.

In additional embodiments, the manufacturing system further includes a third annealing system positioned on a fabrication floor and a fourth annealing system positioned on the fabrication floor. The third annealing system includes a vertical furnace having a processing space, a workpiece boat to carry at least one hundred workpieces, a boat loader arranged beneath the vertical furnace and configured to vertically translate the workpiece boat and position the workpieces within the processing space, and a magnet positioned outside the vertical furnace and configured to generate a magnetic field within the processing space. The fourth annealing system positioned includes a vertical furnace having a processing space, a workpiece boat to carry at least one hundred workpieces, a boat loader arranged beneath the vertical furnace and configured to vertically translate the workpiece boat and position the workpieces within the processing space, and a magnet positioned outside the vertical furnace and configured to generate a magnetic field within the processing space. The third and fourth annealing systems are positioned on the fabrication floor to have a combined footprint of less than 9.5 m² (square meters).

In additional embodiments, the vertical furnace for the first annealing system and the vertical furnace for the second annealing system each includes an inner cylindrical insulating tube and at least one heating element surrounding an outer surface thereof, the inner cylindrical insulating tube defining the processing space. In further embodiments, the at least one heating element for each of the first and second annealing systems is configured to elevate a temperature of the plurality of workpieces to a peak temperature ranging up to about 600 degrees Celsius.

In additional embodiments, the manufacturing system further includes a first workpiece handling robot configured to load and unload two workpieces at a time into and out of the workpiece boat for the first annealing system and includes a second workpiece handling robot configured to load and unload two workpieces at a time into and out of the workpiece boat for the second annealing system. In further embodiments, the workpiece handling robot for each of the first and second annealing systems is configured to load two workpieces at a time into the workpiece boat. In still further embodiments, the workpiece handling robot for each of the first and second annealing systems is configured to unload two workpieces at a time out of the workpiece boat.

In additional embodiments, the magnet systems for the first and second annealing systems each includes at least one of a superconducting magnet, an electromagnet, a permanent magnet, a solenoid magnet, or a Helmholtz magnet.

In additional embodiments, the first and second annealing systems each further includes a workpiece boat turntable arranged beneath the vertical furnace and configured to support at least two workpiece boats and to index the at least two workpiece boats between a process position and a load/unload position.

In additional embodiments, the boat loader for each of the first and second annealing systems includes a loading arm, a platform, and a drive system. The loading arm is oriented vertically and characterized by a length (La) that is sufficiently long to locate the workpiece boat within the vertical furnace; the platform is located at a distal end of the loading arm and configured to engage and to support the workpiece boat when loading and unloading the workpiece boat to and from the vertical furnace; and the drive system located at an opposing distal end of the loading arm and configured to vertically translate the workpiece boat. In further embodiments, the loading arm for each of the first and second annealing systems is a retractable loading arm.

For one embodiment, a method to anneal multiple batches of workpieces is disclosed including loading at least one hundred workpieces into a first workpiece boat for a first annealing system positioned on a fabrication floor and loading at least one hundred workpieces into a second workpiece boat for a second annealing system positioned on a fabrication floor. The first annealing system further includes a vertical furnace having a processing space, a boat loader arranged beneath the vertical furnace and configured to vertically translate the workpiece boat and position the workpieces within the processing space, and a magnet positioned outside the vertical furnace and configured to generate a magnetic field within the processing space. The second annealing system further includes a vertical furnace having a processing space, a boat loader arranged beneath the vertical furnace and configured to vertically translate the workpiece boat and position the workpieces within the processing space, and a magnet positioned outside the vertical furnace and configured to generate a magnetic field within the processing space. The method also includes vertically translating the first and second workpieces into the processing spaces of the vertical furnaces using the boat loaders for the first and second annealing systems, elevating temperatures for the least one hundred workpieces loaded into the first workpiece boat and for the least one hundred workpieces loaded into the second workpiece boat, and generating magnetic fields within the processing space for the first annealing system using the magnet for the first annealing system and within the processing space for the second annealing system using the magnet system for the second annealing system. Further for the method, the first and second annealing systems are positioned on the fabrication floor to have a combined footprint of less than 9.5 m² (square meters).

In additional embodiments, the magnet for the first annealing system and the magnet for the second annealing system each includes a vertical passive magnet. In further embodiments, the first and second annealing systems are further configured to have a combined vertical footprint less than a height limit of between 3.5 meters to 4.2 meters.

In additional embodiments, wherein the magnet for the first annealing system and the magnet for the second annealing system each has a magnetic field that decreases to 5-Gauss within a distance (X) from a middle vertical axis of the magnet where $0.4$ meters$\leq X \leq 1.1$ meters. In further embodiments, the magnet for the first annealing system and the magnet for the second annealing system each provides a magnetic field up to a level (M) within the processing space for each annealing system where $M \geq 1$ Tesla. In still further embodiments, a 5-Gauss field line associated with the second annealing system either does not overlap with a 5-Gauss field line associated with the first annealing system or overlaps with the 5-Gauss field line associated with the first annealing system by less than or equal to 10 percent of the distance (X). In additional further embodiments, a 5-Gauss field line associated with the second annealing system either does not overlap with a 5-Gauss field line associated with the first annealing system or overlaps with the 5-Gauss field line associated with the first annealing system by less than or equal to 0.2 percent of the distance (X).

In additional embodiments, the first and second annealing systems are positioned in an offset, side-by-side arrangement. In further embodiments, the method includes accessing the first annealing system to service the first annealing system from a first service area located on a first side of the first and second annealing systems, and accessing the second annealing system to service the second annealing system from a second service area located on a second side of the first and second annealing systems.

In additional embodiments, the method includes loading at least one hundred workpieces into a third workpiece boat for a third annealing system positioned on a fabrication floor and loading at least one hundred workpieces into a fourth workpiece boat for a fourth annealing system positioned on a fabrication floor. The third annealing system further includes a vertical furnace having a processing space, a boat loader arranged beneath the vertical furnace and configured to vertically translate the workpiece boat and position the workpieces within the processing space, and a magnet positioned outside the vertical furnace and configured to generate a magnetic field within the processing space. The fourth annealing system further includes a vertical furnace having a processing space, a boat loader arranged beneath the vertical furnace and configured to vertically translate the workpiece boat and position the workpieces within the processing space, and a magnet positioned outside the vertical furnace and configured to generate a magnetic field within the processing space. The method also includes vertically translating the third and fourth workpieces into the processing spaces of the vertical furnaces using the boat loaders for the third and fourth annealing systems, elevating temperatures for the least one hundred workpieces loaded into the third workpiece boat and for the least one hundred workpieces loaded into the fourth workpiece boat, and generating magnetic fields within the processing space for the third annealing system using the magnet for the third annealing system and within the processing space for the fourth annealing system using the magnet system for the fourth annealing system. Further for the method, the third and fourth annealing systems are positioned on the fabrication floor to have a combined footprint of less than 9.5 m$^2$ (square meters).

Different or additional features, variations, and embodiments can be implemented, if desired, and related systems and methods can be utilized, as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
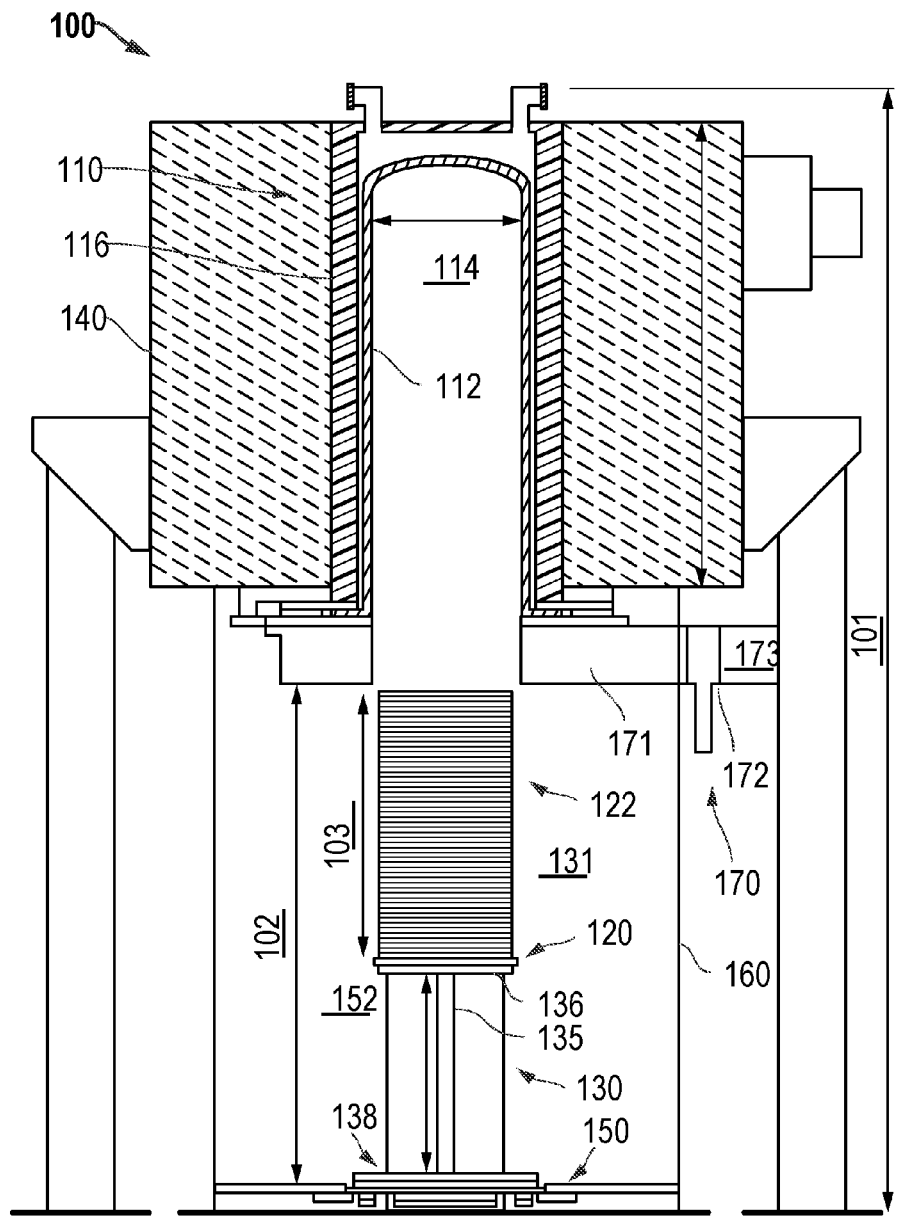
FIG. 1 is a schematic illustration of a side view of an example embodiment for an annealing system according to an embodiment.

Embodiments are described for annealing systems and methods to process microelectronic workpieces using vertical multi-batch perpendicular magnetic annealing systems that allow for a side-by-side configuration of multiple annealing systems to satisfy reduced footprint requirements.

Certain example embodiments described herein include a perpendicular magnetic annealing system capable of processing a wafer batch size of 200×300 mm wafers while retaining a tool footprint within height limits of 3.5 meters (m) to 4.2 m and having a floor footprint of less than 9.5 m$^2$ (square meters). The annealing system embodiments are also configured to allow for offset, side-by-side positioning to reduce the overall fabrication footprint and to remove requirements for side maintenance access to each of the annealing systems. In addition, the annealing system embodiments can incorporate a solenoid magnet, a superconducting magnet, an electromagnetic, a permanent magnet, and/or other magnet systems. In addition, the annealing system embodiments can include a vacuum oven for controlled process environment, a wafer transfer system, wafer handling robot, FOUP (Front Opening Unified Pod) stocker, controlled mini-environment, gas/water/pneumatics distribution, and/or other system features or components. Additional features and variations can be implemented, if desired, and related systems and methods can be utilized, as well.

It is initially noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. It is noted that numbered reference numbers used within the description may refer to like numbered reference numbers appearing in one or more previous and/or subsequent drawings as liked numbered reference numbers are utilized herein to indicate similar items in the description and drawings.

Figure 8:
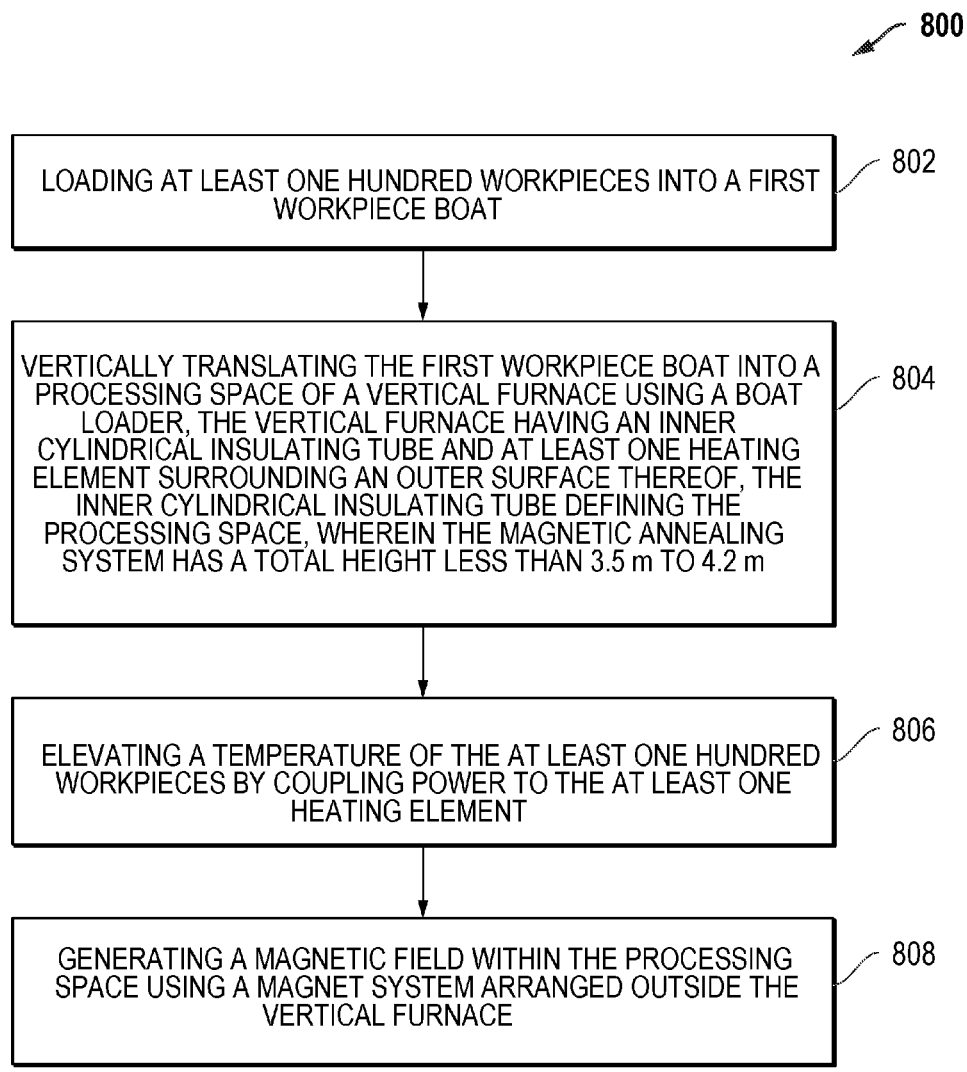
FIG. 8 illustrates a method for annealing a plurality of workpieces in an annealing system according to an embodiment.

Looking now to the drawings, FIGS. 1-4 describe example embodiments that provide configurations for magnetic annealing systems that are compatible with one hundred (100) workpiece capacity and SEMI S2 height requirements (3.5 m). FIG. 8 provides an example embodiment for method for annealing a plurality of workpieces in an annealing system according to an embodiment. These embodiments, as well as additional embodiments, are also described within U.S. Pat. No. 9,410,742, which is hereby incorporated by reference in its entirety.

Figure 5:
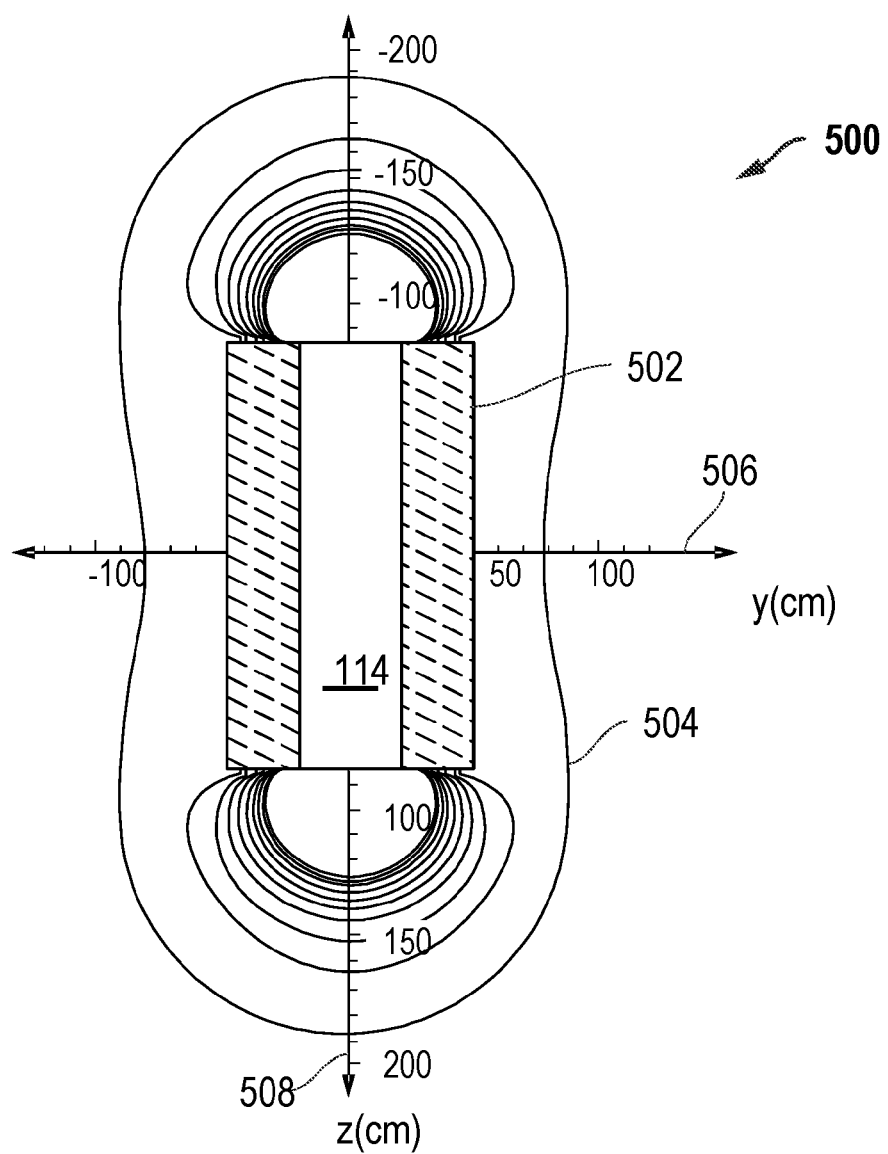
FIG. 5 is an example embodiment for a magnetic field associated with a vertical passive magnet that can be used for vertical multi-batch magnetic annealing systems that allow for an offset, side-by-side configuration on a fabrication floor to satisfy reduced footprint requirements.
Figure 6:
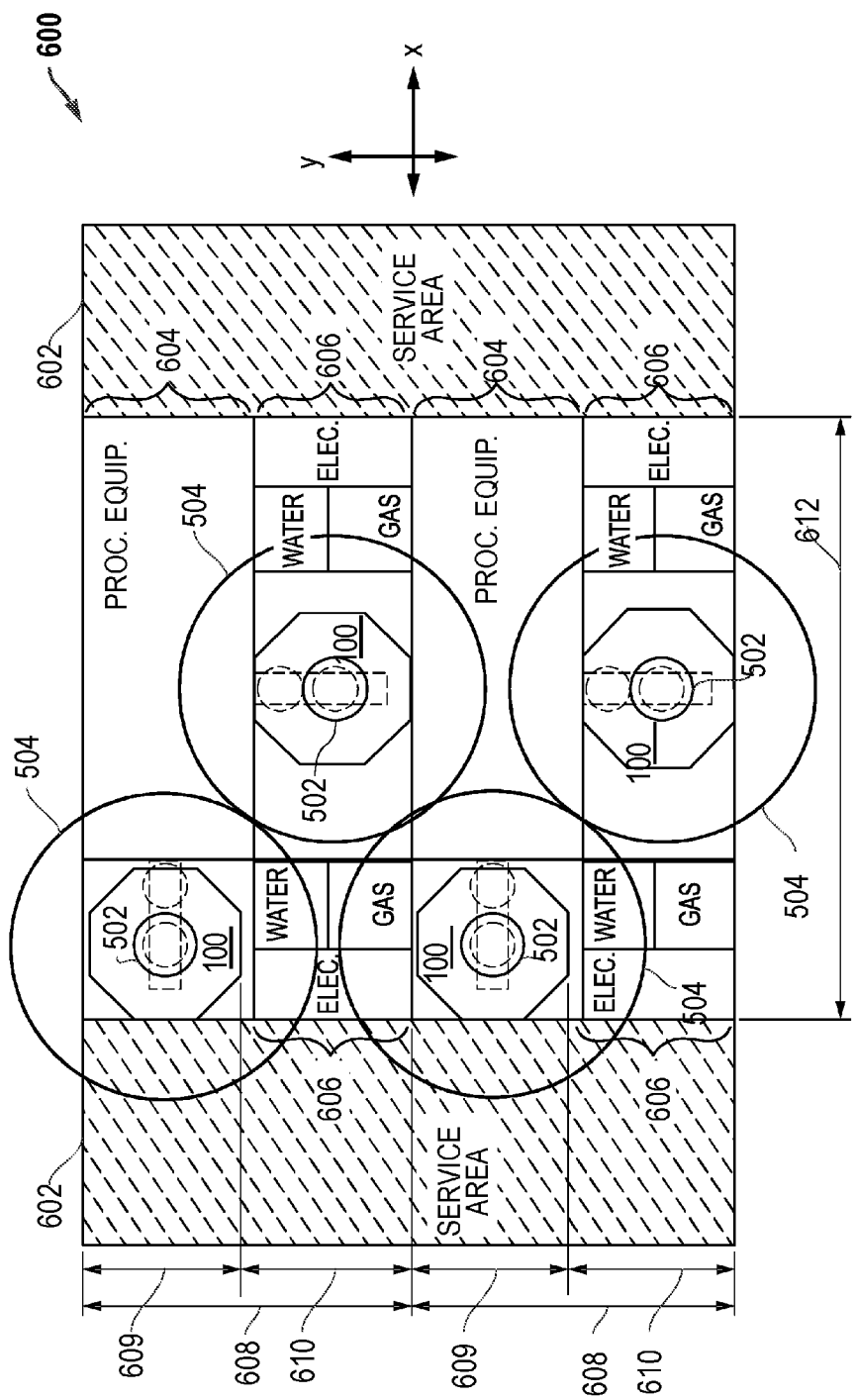
FIG. 6 is a plan view diagram of an example embodiment for an offset, side-by-side configuration for multiple annealing systems that use magnets having properties described with respect to FIG. 5.
Figure 7:
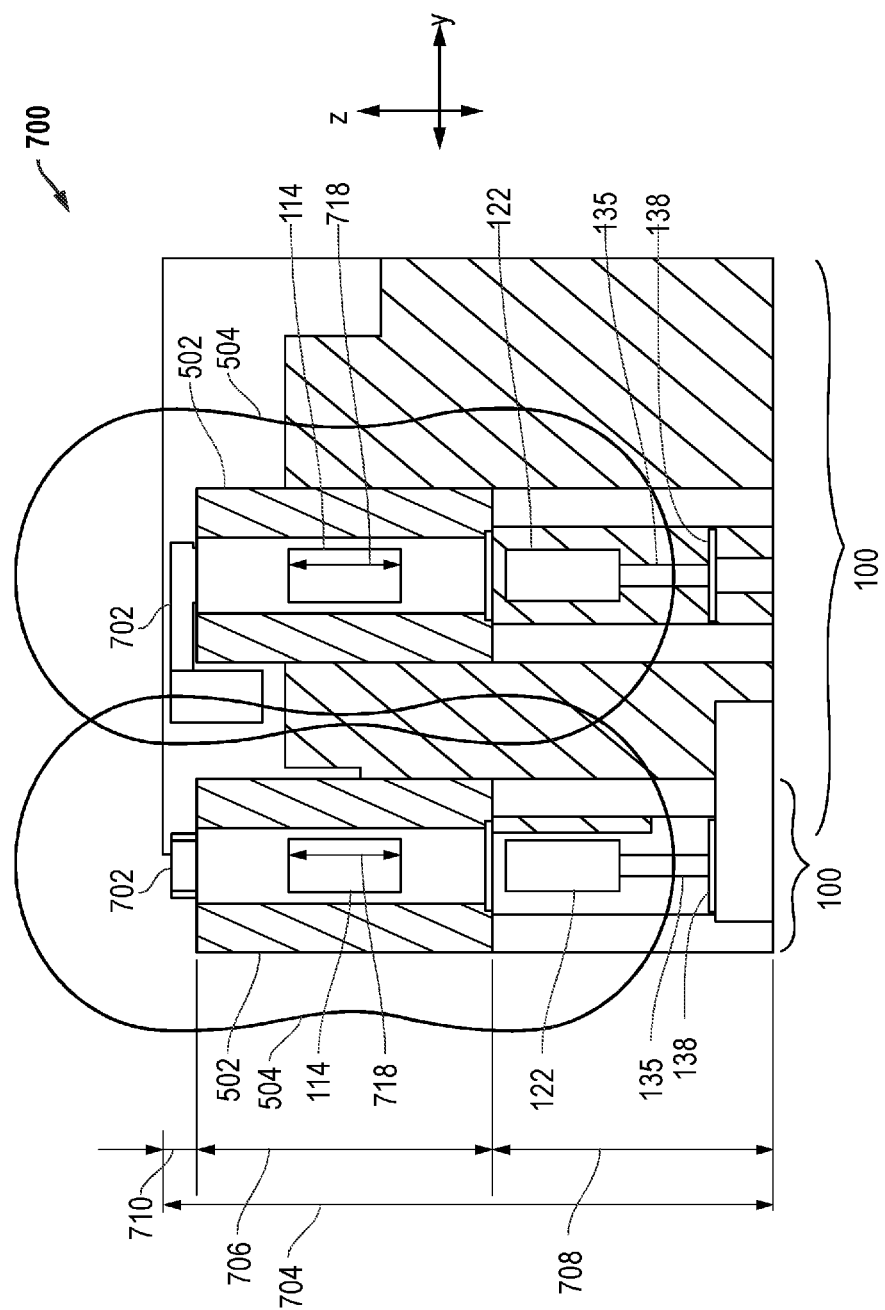
FIG. 7 is an example elevation view diagram of an example embodiment for two of the annealing systems shown in FIG. 6.

FIGS. 5-7 provide example embodiments for systems and methods to anneal one or more layers containing magnetic material on microelectronic workpieces using a vertical multi-batch perpendicular magnetic annealing system. These disclosed embodiments include a perpendicular magnetic annealing system capable of processing a wafer batch size of 200×300 mm wafers while retaining a tool footprint within height limits of 3.5 meters (m) to 4.2 m and having a floor footprint of less than 9.5 m² (square meters). The annealing systems are also configured to allow for side-by-side positioning to reduce overall fabrication footprint and to remove the requirement for side maintenance access to the annealing systems. These embodiments provide improvements to the embodiments disclosed in U.S. Pat. No. 9,410,742, which is again hereby incorporated by reference in its entirety.

Figure 2:
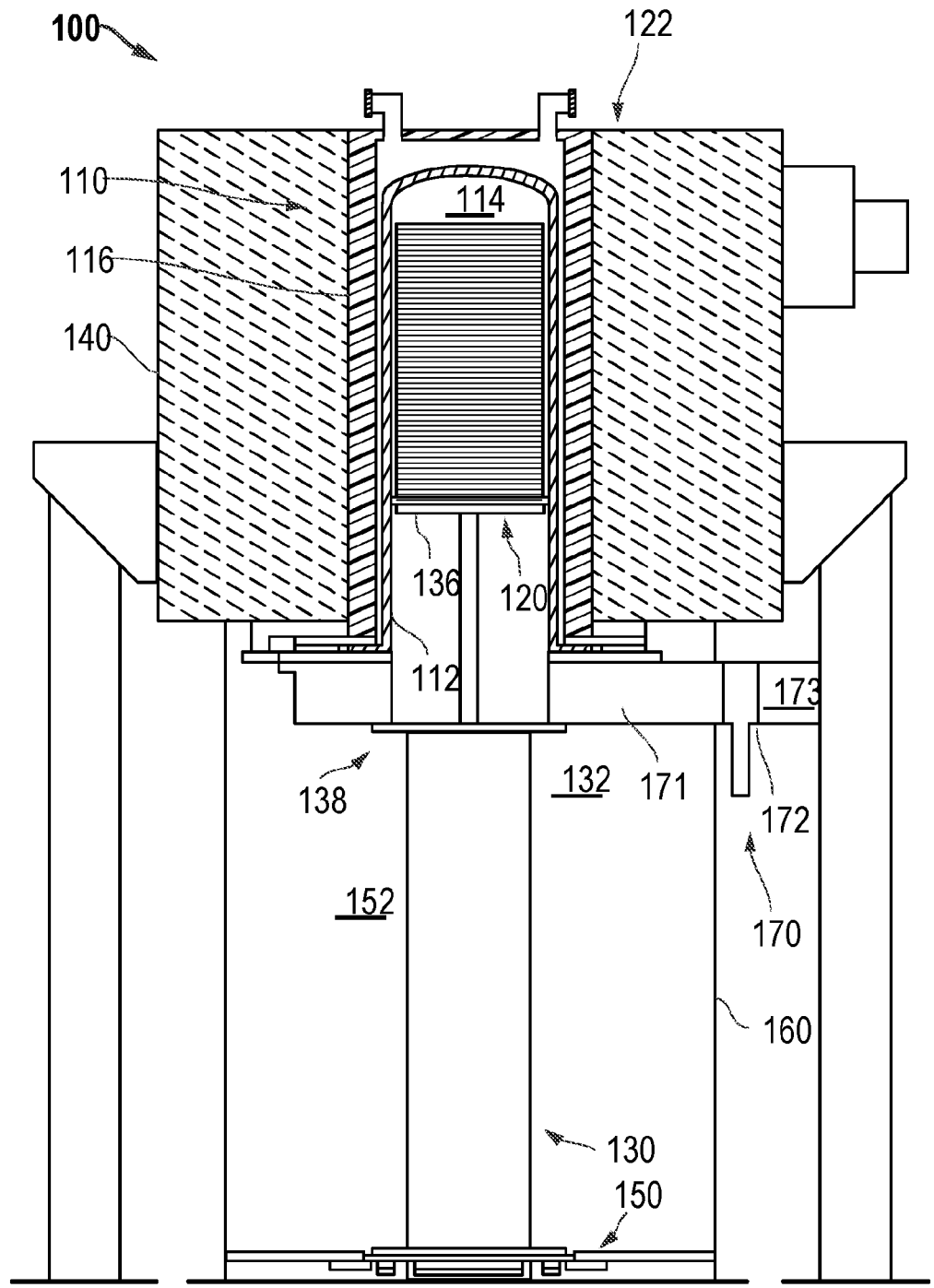
FIG. 2 is another schematic illustration of the annealing system depicted in FIG. 1.

Looking now to FIGS. 1 and 2, an annealing system is illustrated for annealing a plurality of workpieces according to an embodiment. Annealing system 100 includes a vertical furnace 110 having an inner cylindrical insulating tube 112 and at least one heating element assembly 116 surrounding an outer surface thereof, wherein the inner cylindrical insulating tube 112 defines a processing space 114 into which a plurality of workpieces 122 may be vertically translated and subjected to thermal and/or magnetic processing.

It will be understood by those skilled in the art that the workpieces can be semiconductor substrates, wafers, MRAM devices/chips, giant magneto resistance (GMR) heads, hard disc drives, and any other device that may be annealed at an elevated temperature with or without a magnetic field present. Workpieces may include, for example, semiconductor wafers used in the manufacture of MRAM devices, wafers used in the manufacture of MTJ devices, GMR sensors, magnetization of metallic objects at elevated temperatures, degaussing of magnetic thin films, and other objects that require annealing under the influence of magnetic fields.

The annealing system 100 further includes a workpiece boat 120 for carrying at least one hundred workpieces 122, and a boat loader 130 arranged beneath the vertical furnace 110, and configured to vertically translate the workpiece boat 120 and position the workpieces 122 within the processing space 114. The workpieces 122 may be arranged in a horizontal orientation for closely spacing the workpieces 122 in processing space 114. In this orientation, for example, out-of-plane (e.g., perpendicular) magnetic annealing may be performed. The workpieces 122, which may include semiconductor workpieces, may be placed at a non-variable or variable pitch of about 2 mm to about 10 mm, when wafers are processed, in order to effectively perform the thermal cycle. For example, the plurality of workpieces may be arranged within the workpiece boat 120 at a pitch equal to or less than 6.5 mm. As yet another example, the pitch may range from 4 mm to 4.5 mm.

Figure 3:
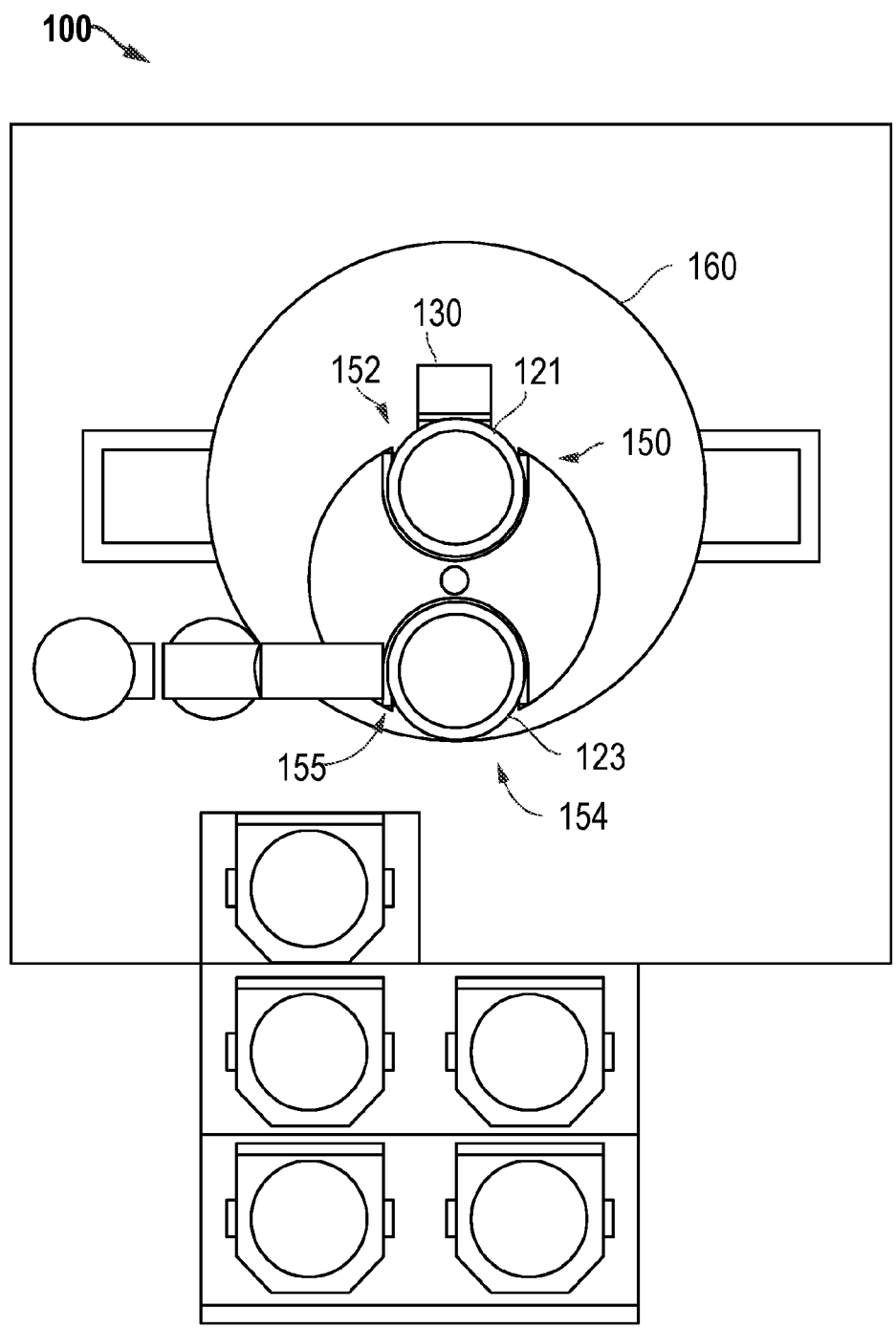
FIG. 3 is a schematic illustration of a top view of the annealing system depicted in FIG. 1.

Furthermore, as shown in FIGS. 1 and 3, the annealing system 100 includes a workpiece boat transport system 150 arranged beneath the vertical furnace 110, and configured to support at least two workpiece boats 121, 123 and index the at least two workpiece boats 121, 123 between a process position 152 and a load/unload position 154. The workpiece boat transport system 150 has an opening 155 to permit the boat loader 130 to engage and vertically translate the workpiece boat 120 into and out of the vertical furnace 110. The boat loader 130 and workpiece boat transport system 150 may be housed within an enclosure 160 to facilitate a reduced contamination environment.

The boat loader 130 is positioned in the process position 152, yet at a first elevation 131 beneath the vertical furnace 110. In FIG. 2, boat loader 130 is positioned in the process position 152, yet at a second elevation 132, wherein the workpiece boat 120 and workpieces 122 are placed within the vertical furnace 110. To achieve vertical elevation changes, the boat loader 130 includes a loading arm 135 oriented vertically and characterized by a length 104, $L_a$, that is sufficiently long to locate the workpiece boat 120 within the bore of the magnet system 140 and the vertical furnace 110. The length $L_a$ of the loading arm 135 may range up to about 1 m. The boat loader 130 further includes a platform 136 located at a distal end of the loading arm 135, and configured to engage and support the workpiece boat 120 when loading and unloading the workpiece boat 120 to and from the vertical furnace 110, and a drive system 138 located at an opposing distal end of the loading arm 135, and configured to vertically translate the workpiece boat 120.

As shown in FIG. 1, the annealing system 100 has a total height 101 less than or equal to 3.500 m. To do so, for example, the height 102 of the enclosure 160 underneath the vertical furnace 110 (from the bottom of the vertical furnace 110 to the workpiece boat transport system 150) is less than or equal to 1.400 m, and the height 103 of the workpiece stack is less than or equal to 0.460 m.

In the second elevation, the vertical furnace 110 may be sealed and evacuated to a reduced pressure relative to ambient pressure using pumping system 170. A process gas may or may not be introduced to the vertical furnace 110 at a predetermined flow rate from a gas source (not shown). As shown in FIGS. 1 and 2, vertical furnace 110 is connected via evacuation line 171 to pumping system 170 for evacuating the process chamber and creating vacuum therein. The pumping system 170 may include a vacuum pump 173 and valve 172, which in tandem permits controllably drawing a vacuum in the range of 10-8 to 100 Torr. In an exemplary embodiment, the vacuum pump 173 may include a roughing pump and/or a high vacuum pump. The roughing pump is employed to draw a vacuum to about 10-3 Torr, while the high vacuum pump is subsequently employed to further reduce the vacuum pressure to 10-7 Torr or lower. The roughing pump can be selected from among an oil sealed pump or dry pump, while the high or hard vacuum pump can be selected from among, turbomolecular pumps, diffusion pumps, cryo-pumps, or any other device capable of drawing the requisite vacuum.

Furthermore, the annealing system 100 includes a temperature control system (not shown) coupled to the heating element assembly 116 and configured to controllably adjust the temperature of the workpieces 122 to a predetermined value or sequence of values of temperature. The temperature control system may include one or more arrays of heating elements arranged around or adjacent to the vertical furnace 110 (e.g., arranged to surround the vertical furnace 110), and configured to heat and cool the workpieces 122 according to an anneal temperature recipe. For example, the one or more arrays of heating elements may include one or more resistive heating elements, one or more heated or cooled fluid conduits or jackets, one or more radiation sources (e.g., infrared (IR) source/lamp, ultraviolet (UV) source/lamp, etc.), etc.

Further yet, the annealing system 100 includes a magnet system 140 arranged outside the vertical furnace 110, and configured to generate a magnetic field within the processing space 114. The magnetic field may be designed to possess a predetermined magnetic field strength and orientation within the interior of the vertical furnace 110. The magnet system 140 may include one or more magnets arranged in a solenoidal or Helmholtz configuration around or adjacent the vertical furnace 110. For example, the magnet system 140 may include a superconducting magnet, an electromagnet, or a permanent magnet, or a combination of two or more thereof. The magnet system 140 can be configured to generate a magnetic field ranging from about 0.02 to 10 T (Tesla) within the vertical furnace 110.

While not shown, the annealing system 100 may also include a controller coupled to the temperature control system, the magnet system 140, and the pumping system 170, and configured to send and receive programmable instructions and data to and from the components of the annealing system 100. For example, the controller may be programmed to control the anneal temperature of the workpieces, the anneal time period, the magnetic field strength, the pressure in the vertical furnace 110, the process gas flow rate (if any) delivered to the vertical furnace 110, and the temporal and/or spatial variation of any of these process parameters.

Figure 4:
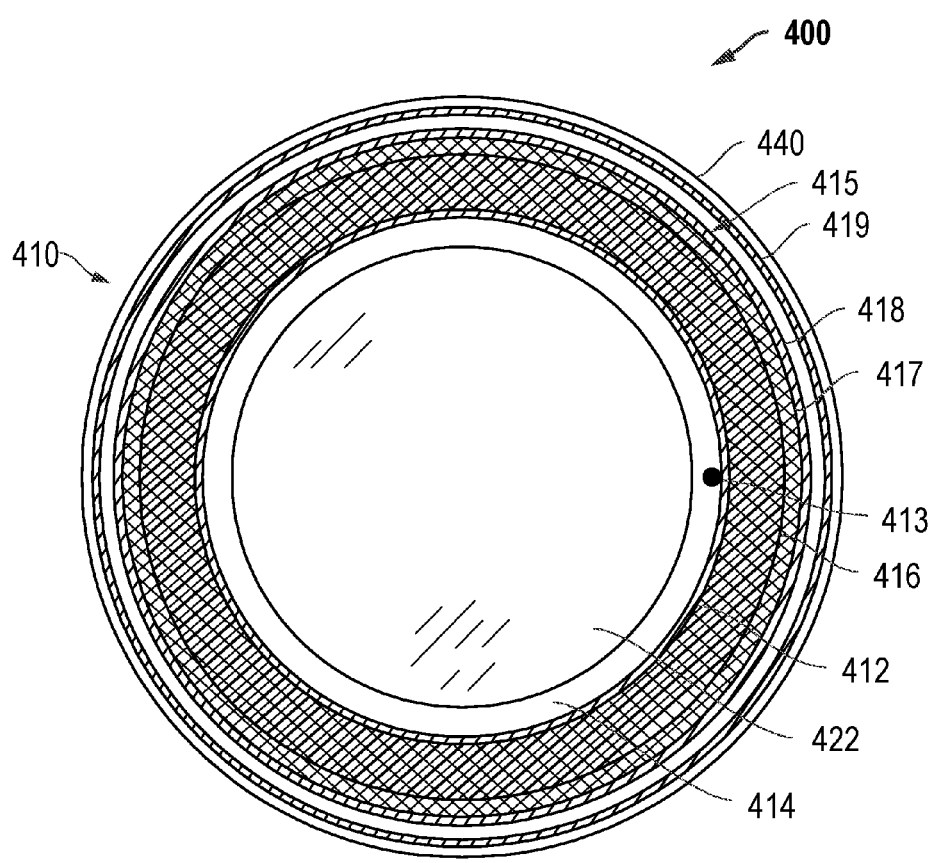
FIG. 4 provides a cross-sectional view of at least part of an annealing system according to one embodiment.

Referring now to FIG. 4, a cross-sectional view of at least part of an annealing system 400 is provided according to an embodiment. More specifically, this partial cross-section details the structure of vertical furnace 110 beginning with the inner wall 440 of the magnet bore outside vertical furnace 410 and proceeding radially inward to the processing space 414 within which workpieces 422 are treated.

Surrounding processing space 414 is inner cylindrical insulating tube 412. Inner cylindrical insulating tube 412 surrounds the workpieces 422, and forms a barrier between processing space 414 and heating element assembly 416. The inner cylindrical insulating tube 412 may be sealed at either distal end by means of demountable gasket seals (e.g., O-rings). Furthermore, the inner cylindrical insulating tube 412 may be composed of any type of material suitable for use in a semiconductor fab. Preferred materials are those with high emissivity, high thermal conductivity, or low heat capacity, or a combination thereof. Typically, the inner cylindrical insulating tube 412 is manufactured from transparent, fused silica glass (i.e., quartz), which is partially transparent to wavelengths in the electromagnetic spectrum ranging from of 0.78 to 1000 microns (e.g., infrared spectrum), or silicon carbide which has high emissivity and thermal conductivity.

When manufacturing silicon workpieces in a temperature range of 100 to 400 degrees Celsius (C), for example, the transmissivity of the quartz wall or tube ranges from 5 to 12 percent, which in accordance with Kirchoff's law, the emissivity of the quartz is in the range of 88 to 95 percent. Alternatively, the inner cylindrical insulating tube 412 can include stainless steel. Although stainless steel has a lower emissivity than quartz or silicon carbide, the tube may be fabricated thinner, thereby reducing total heat capacity, as well as reducing the bore dimension of the magnet. Furthermore, stainless steel can be welded or sealed in other ways that are not possible with quartz or silicon carbide.

Surrounding the inner cylindrical insulating tube 412 is the heating element assembly 416. The heating element assembly 416 includes one or more heating elements, such as resistive heating elements. Preferably, the heater elements are selected from an array of electrical resistance heaters sufficient to provide and maintain an anneal temperature. As utilized herein, annealing temperatures range from about 200-1000 degrees C., depending on the device being manufactured. Furthermore, the heater elements may be wound so as to cancel out forces generated by the strong magnetic field in which they are disposed.

As an example, the one or more heating elements may include metal heating elements composed of nickel-chrome alloys or iron-chrome alloys, ceramic heating elements, or composite heating elements. Furthermore, the heating element assembly 416 may include one or more heating assembly zones that can be independently monitored and controlled using, for example, one or more sensors 413. For example, spatially controlled, or uniform, heating of the workpieces 422 can be accomplished by independently providing energy and control of the various heater elements in the heating element assembly 416. In one embodiment, the heater elements are divided axially into three different zones, wherein the center zone heater is aligned with the workpiece stack. And, two end zone heaters are provided above and below the center heater, respectively, and are independently controlled. Alternatively, the center zone heater may be divided into two independently controlled central heating zones.

In another embodiment, the heaters can be divided azimuthally into separate zones, for instance, three heaters each covering 120 degrees C. The power input to each heated zone can be varied separately to achieve uniform heating. Generally, the thermal mass of the heater elements and inner cylindrical insulating tube 412 should be minimized to reduce the power input for a given temperature rise, and heat removal for a given temperature drop. In other words, it is desirable for the workpieces 422 to be the largest thermal mass in the system. In this manner, the possibility of temperature non-uniformity is greatly reduced.

In a particular embodiment, the heating element assembly 416 may include an element chamber that can be sealed and fluidly connected to a means for drawing a vacuum within the element chamber. The means for drawing vacuum can include any one or more of the pumps described above with respect to vertical furnace 110. Separately, a heat transfer gas can be introduced into the element chamber, and the environment surrounding the heating elements may be controlled.

Surrounding the heating element assembly 416 is an insulation layer 417 to thermally shield the magnet system from the heating element assembly 416. The insulation layer 417 may include MICROTHERM® panels commercially available from Microtherm nv, BE.

Surrounding the insulated, heating element assembly 416 is a cooling jacket that includes a pair of outer cylindrical tubes 418, 419 between which is an annular channel 415 for flowing a heat transfer fluid. Heat transfer fluid can be circulated through the annular channel 415 at a flow rate of about 1 to 20 liters per minute (e.g., 5-10 liters per minute), and at a temperature of about 20 degrees C. (other temperatures are acceptable). The annular channel 415 is configured for maximum heat transfer efficiency when the heating element assembly 416, or both the heating element assembly 416 and the vertical furnace 410 are running in conduction mode (i.e., during the cooling phase of the thermal/anneal cycle), and prevents the overheating of the magnet system by maintaining the exterior temperature below about 35 degrees C. The heat transfer fluid employed in the annular channel 415 may include, but is not limited to, water, a 50/50 solution of water and ethylene glycol, or any fluid that provides the requisite cooling temperature. In the event ethylene glycol is used, a cooling temperature lower than 20 degrees C. can be obtained. Forced air cooling could also be used.

Annealing systems 100, 400 may be operable for magnetic and non-magnetic annealing of workpieces. The anneal process condition, including the anneal temperature recipe, is selected depending on the desired film properties of layers to be annealed on the workpiece.

FIGS. 5-7 provide improvements to the annealing systems described in FIGS. 1-4. In particular, example embodiments are described with respect to FIGS. 5-7 that provide systems and methods to anneal one or more layers containing magnetic material on microelectronic workpieces using a vertical multi-batch perpendicular magnetic annealing system 40 that allows for configurations of multiple annealing systems to satisfy reduced footprint requirements. As indicated above, these disclosed embodiments include a perpendicular magnetic annealing system capable of processing a wafer batch size of 200×300 mm wafers while retaining a tool footprint within height limits of 3.5 m to 4.2 m and having a floor footprint of less than 9.5 m². The annealing systems are also configured to allow for side-by-side positioning to reduce overall fabrication footprint and to remove the requirement for side maintenance access to the annealing systems.

FIG. 5 is an example embodiment 500 for a magnetic field associated with a vertical passive magnet 502 that can be used within the magnetic system 140 within the annealing systems 100 described herein (which can include the embodiment 400 shown in FIG. 4 for at least a part of an annealing system). Further, as described in more detail with respect to FIGS. 6-7, the use of the vertical passive magnet 502 and/or a magnetic with similar characteristics allows for an advantageous offset, side-by-side configuration of multiple annealing systems that reduce footprint requirements for fabrication floors.

In embodiment 500, the magnetic field lines are shown with respect to a Y (horizontal) axis 506 through the center of the vertical passive magnet 502 and to a Z (vertical) axis 508 through the center of the vertical passive magnet 502. In particular, a 5-Gauss (i.e., $5 \times 10^{-4}$ Tesla (T)) magnetic field line 504. As shown, this 5-Gauss magnetic field line 504 for the vertical passive magnet 502 extends to about 100 cm in the plus/minus directions with respect to the Y-axis and to about 180 cm in the plus/minus directions with respect to the Z-axis 508. Preferably, the vertical passive magnet 502 provides a magnetic field (M) within the processing space 114 for the annealing system 100 of up to at least 1 T (e.g., M≥1 T), and preferably up to at least 5 T (e.g., M≥1 T), while having a 5-Gauss field line (X) that falls between 0.4 m to about 1.1 m (e.g., 0.4≤X≤1.1 m) from the Z (vertical) axis 508 through the center of the vertical passive magnet 502.

As indicated above, a magnet or magnet system that provides similar characteristics can also be used instead of the vertical passive magnet 502. For example, a solenoid magnet, a superconducting magnet, an electromagnetic, a permanent magnet, and/or other magnet configurations can be used for the vertical passive magnet 502. One example of vertical passive magnet 502 is a vertical passive magnet having the following characteristics: system height (h) ranging from 1000 mm≤h≤1700 mm (millimeters); homogenous zone ranging in diameter (d) from 200 mm≤d≤350 mm and height (h) ranging from 500 mm≤h≤700 mm; homogeneity of ≤±6%; angular uniformity of ≤5° (degrees); weight of ≥1,000 kg; and 5 Gauss stray field of ≥1.2 m axially from the magnet center and ≥1 m radially from the magnet center with respect to the magnet bore.

FIG. 6 is a plan view diagram of an example embodiment 600 for an offset, side-by-side configuration of annealing systems 100 that use the magnet 502 described with respect to FIG. 5. This offset, side-by-side configuration achieves desired footprint requirements while not requiring side entry to each of the annealing systems 100. As such, the offset, side-by-side positioning reduces the overall fabrication footprint and removes requirements for side maintenance access to the annealing systems. In addition, the fabrication system environments can incorporate additional components, such as vacuum ovens for controlled process environments, wafer transfer systems, wafer handling robots, FOUP (Front Opening Unified Pod) stockers, controlled mini-environments, gas/water/pneumatics distribution systems, and/or other system features or components.

As depicted for example embodiment 600, four magnetic annealing systems 100 that include a vertical passive magnet 502 are shown along with their respective 5-Gauss magnetic field lines 504. Due to the advantages provided by the use of the vertical passive magnet 502 or similar magnet or magnet system, the annealing systems 100 can be positioned in an offset, side-by-side configuration on the fabrication floor with little or no overlap of the 5-Gauss magnetic field lines 504. For example, an overlap of 5-Gauss lines of less than or equal to 10 percent (e.g., overlap≤10%), and preferably less than or equal to 0.2% (e.g., overlap≤0.2%), is provided while still falling within the desired footprint requirements. As such, the footprint for the multiple annealing systems is greatly reduced and side maintenance access is not required. Rather, service clearance areas 602 can be provided on both edges of the fabrication floor. These service clearance areas 602 provide access to the various fabrication equipment and/or components associated with the annealing systems 100. For example, access is provided to electrical, water, and gas systems 606 that are used for the annealing systems 100. Additional wafer processing equipment 604 can also be included within the fabrication system. This additional wafer processing equipment 604 can include, for example, wafer handling automation for wafer transfer from FOUP to wafer processing boat, FOUP stocker system for handling & storage of wafer FOUPs, process boat loading system for loading process boat into the reactor chamber, and/or other equipment or components associated with the workpiece processing.

Example dimensions for the side-by-side configuration for embodiment 600 are now described with respect to the fabrication floor plane indicate by the X/Y axes. The footprint for the annealing systems 100 in the X-axis, for example, can be 4.0 meters for the width 612. This width 612 allows for one annealing system 100 along with the electrical/water/gas systems 606 for two of the four annealing systems 100. The Y-axis length 610 associated with this portion of the footprint can be, for example, 1.137 meters. The X-axis width 612 also allows for two annealing systems 100 along with the additional wafer processing equipment 604 for the four annealing systems 100. The Y-axis length 609 associated with this portion of the footprint can be, for example, 1.0 meters. The overall Y-axis length 608 for each pair of side-by-side annealing systems 100 can be, for example, 2.137 meters. As such, for these example measurements, two annealing system 100s and related equipment 604/606 have a combined floor footprint of less than 9.5 $m^2$ (e.g., 2.137 m×4.0 m=8.548 $m^2$ which is less than 9.5 $m^2$). Variations to these dimensions could also be implemented while still taking advantage of the offset, side-by-side embodiments described herein.

FIG. 7 is an example elevation view diagram of an example embodiment 700 for two of the annealing systems 100 shown in FIG. 6. Each of these annealing systems 100 have a vertical passive magnet 502 for the magnet system, and the 5-Gauss field line 504 is depicted for each. As shown in FIG. 6, the offset, side-by-side configuration for the annealing systems 100 along with the use of the vertical passive magnets for the magnet systems 140 allow for reductions in required footprint while still satisfying desired throughput requirements.

Example dimensions for the offset, side-by-side configuration for embodiment 700 are now described with respect to the Y/Z axes. The overall Z-axis height 704 for the annealing system 100 can be, for example, 3.5 meters. Preferably, this Z-axis height 704 is less than 4.2 m such that the combined footprint is within a height limit of 3.5 meters to 4.2 meters. The Z-axis length of the processing space 114 can be, for example, 0.65 meters. The Z-axis length 706 of the annealing chamber can be 1.7 meters. The Z-axis length 708 for the vertical delivery system can be, for example, 1.6 meters. Variations to these dimensions could also be implemented while still taking advantage of the offset, side-by-side embodiments described herein.

In an exemplary embodiment, a method for annealing workpieces at a certain temperature so as to orient the crystals in a specific direction is contemplated. Workpieces 122, 422 are placed onto a boat for treatment within a vertical furnace in a predetermined environment. The workpieces 122, 422 are held at a predetermined temperature, while a magnetic field is optionally applied via magnet system 140. For example, the optionally imposed magnetic field may have a field strength of approximately 0.05 T to approximately 10 T, e.g., 1 T, 2 T, or 5 T. This latter step is commonly referred to as a "soaking" step.

Thereafter, steps are taken to achieve the desired cooling effect (i.e., heat transfer from the workpieces 122, 422, to the heat transfer fluid in the annular chamber 415). Cooling of workpieces 122, 422 proceeds to attain a temperature sufficiently low to allow their removal from the annealing system 100, 400. An exemplary anneal process condition associated with magnetic annealing may include a continuous anneal sequence as follows: (i) heating the workpieces 122, 422 to 300 degrees C. for about forty five minutes; (ii) soaking the workpieces 122, 422 for two hours at 300 degrees C.; and (iii) cooling the workpieces 122, 422 to about 100 degrees C. over about seventy minutes.

FIG. 8 illustrates a method for annealing a plurality of workpieces in an annealing system according to an embodiment. The method is illustrated in a flow chart 800 and begins in 802 with loading a plurality of workpieces at least one hundred workpieces into a first workpiece boat. For one example embodiment, eighty to one hundred twenty workpieces are loaded in the first workpiece boat, and for other embodiments at least one hundred workpieces are preferably loaded into the first workpiece. Still further, at least one workpiece may include a multilayer stack of thin films, wherein the multilayer stack of thin films includes at least one layer containing magnetic material.

The multilayer stack may include any material suitable for fabricating a microelectronic device, such as a memory cell depending on layers containing magnetic material for either the basis of its information storage or switching of its memory state(s). These devices may include, but not be limited to, magnetoresistive random access memory (M RAM), current switching toggle magnetic structures, magnetic tunnel junction (MTJ) devices, spin torque transfer (STT) devices, spin valves, and pseudo-spin valves. Exemplary materials may include metals, such as Ru, Co, Fe, Pt, Ta, Ir, Mn, etc., and metal alloys, such as NiFe, CoFe, etc. And, these materials may be deposited using any suitable method, such as sputtering, physical vapor deposition (PVD), chemical vapor deposition (CVD), atomic layer deposition (ALD), and plasma-assisted variations thereof, for example.

In one embodiment, the multilayer stack includes one or more layers containing magnetic material. The layer containing magnetic material may include ferromagnetic and/or anti-ferromagnetic materials. As an example, a microelectronic device having a magnetic tunnel junction (MTJ) can include two electrode layers composed of a ferromagnetic material and separated by a thin tunneling barrier, such as magnesium oxide or aluminum oxide. When the magnetic moments of the two electrode layers are oriented parallel to one another, the resistance to current flow across the magnetic tunnel junction is relatively low. And conversely, when the magnetic moments of the two electrode layers are oriented antiparallel to one another, the resistance to current flow across the magnetic tunnel junction is relatively high. The resultant microelectronic device may be based on the switching of these two resistive states, the performance of which may be characterized by the MR (magneto resistance), as described above.

In 804, the first workpiece boat is vertically translated into a processing space of a vertical furnace using a boat loader, wherein the vertical furnace has an inner cylindrical insulating tube and at least one heating element surrounding an outer surface thereof. Additionally, the inner cylindrical insulating tube defines the processing space, wherein the annealing system has a total height less than 3.5 m to 4.2 m. The annealing system may include any one of the embodiments presented in FIGS. 1 through 7.

Thereafter, in 806, a temperature of the at least one hundred workpieces is elevated by coupling power to the at least one heating element. And, in 808, a magnetic field is generated within the processing space using a magnet system arranged outside the vertical furnace.

The method of annealing may performed according to an anneal process condition that includes: (1) elevating a temperature of the at least one hundred workpieces relative to ambient temperature for an anneal time period according to an anneal temperature recipe, or (2) exposing the at least one hundred workpieces to a magnetic field for an anneal time period according to an anneal magnetic field recipe, or (3) performing both the elevating the temperature of the at least one hundred workpieces and the exposing the at least one hundred workpieces to a magnetic field, wherein the anneal process condition is selected to adjust a property of the layer containing magnetic material.

The anneal process condition may be selected to adjust a property of the layer containing magnetic material. The property of the layer containing magnetic material may include crystallization, uniaxial anisotropy, magnetoresistance ratio (MR), or resistance area product, or a combination of two or more thereof. As an example, the annealing may be performed to transition a composition of the layer containing magnetic material from a substantially amorphous phase to a substantially crystalline phase, and produce a desired anisotropy direction in or at the surface of the layer containing magnetic material.

According to embodiments described herein, the annealing of the layer containing magnetic material may include elevating a temperature of the layer containing magnetic material, or imposing a magnetic field on the layer containing magnetic material, or both elevating a temperature of the layer containing magnetic material and imposing a magnetic field on the layer containing magnetic material.

The anneal process condition may include setting and adjusting one or more process parameters for controlling the annealing process. The one or more process parameters may include an anneal temperature for thermally treating the at least one hundred workpieces when the at least one hundred workpieces require annealing at an elevated temperature, the anneal time period for performing the annealing process, the gaseous composition of the process environment within which the one or more workpieces are annealed, the pressure within the annealing system, the field strength of an imposed magnetic field when the one or more workpieces require annealing in a magnetic field, etc.

During annealing, the anneal temperature of the at least one hundred workpieces may be elevated according to an anneal temperature recipe that includes a peak temperature ranging from about 200 degrees C. to about 600 degrees C. For example, the peak temperature may range from about 250 degrees C. to about 350 degrees C. The anneal time period may range up to about 100 hours. For example, the anneal time period may range from about 1 second to about 10 hours.

Furthermore, during annealing, the at least one hundred workpieces may be exposed to a magnetic field according to an anneal magnetic field recipe that includes a field strength ranging up to 10 T. As a further example, the magnetic field may have a field strength ranging up to 2 T or 5 T or another selected level. The anneal time period may range up to about 100 hours. For example, the anneal time period may range from about 1 second to about 10 hours.

The method of annealing may further include the following: prior to vertically translating the first workpiece boat, indexing the first workpiece boat from a load/unload position to a process position using a workpiece boat transport system arranged beneath the vertical furnace; and loading at least one hundred workpieces into a second workpiece boat, as shown in FIGS. 1-3. Further yet, the method of annealing may include vertically extending a loading arm of the boat loader when vertically translating the first workpiece boat into said vertical furnace; and vertically retracting the loading arm of the boat loader when vertically translating the first workpiece boat out of the vertical furnace, as shown in FIGS. 1-2.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A manufacturing system to anneal multiple batches of workpieces, comprising:
    a first annealing system positioned on a fabrication floor, comprising:
        a vertical furnace having a processing space;
        a workpiece boat to carry at least one hundred workpieces;
        a boat loader arranged beneath the vertical furnace and configured to vertically translate the workpiece boat and position the workpieces within the processing space; and
        a magnet positioned outside the vertical furnace and configured to generate a magnetic field within the processing space; and
    a second annealing system positioned on the fabrication floor, comprising:
        a vertical furnace having a processing space;
        a workpiece boat to carry at least one hundred workpieces;
        a boat loader arranged beneath the vertical furnace and configured to vertically translate the workpiece boat and position the workpieces within the processing space; and
        a magnet positioned outside the vertical furnace and configured to generate a magnetic field within the processing space;
    wherein the first and second annealing systems are positioned on the fabrication floor to have a combined footprint of less than 9.5 m² (square meters).

2. The manufacturing system of claim 1, wherein the magnet for the first annealing system and the magnet for the second annealing system each comprises a vertical passive magnet.

3. The manufacturing system of claim 1, wherein the first and second annealing systems are further configured to have a combined vertical footprint less than a height limit of between 3.5 meters to 4.2 meters.

4. The manufacturing system of claim 1, wherein the magnet for the first annealing system and the magnet for the second annealing system each has a magnetic field that decreases to 5-Gauss within a distance (X) from a middle vertical axis of the magnet where 0.4 meters≤X≤1.1 meters.

5. The manufacturing system of claim 4, wherein the magnet for the first annealing system and the magnet for the second annealing system each provides a magnetic field up to a level (M) within the processing space for each annealing system where M≥1 Tesla.

6. The manufacturing system of claim 5, wherein a 5-Gauss field line associated with the second annealing system either does not overlap with a 5-Gauss field line associated with the first annealing system or overlaps with the 5-Gauss field line associated with the first annealing system by less than or equal to 10 percent of the distance (X).

7. The manufacturing system of claim 5, wherein a 5-Gauss field line associated with the second annealing system either does not overlap with a 5-Gauss field line associated with the first annealing system or overlaps with the 5-Gauss field line associated with the first annealing system by less than or equal to 0.2 percent of the distance (X).

8. The manufacturing system of claim 1, wherein the first and second annealing systems are positioned in an offset, side-by-side arrangement.

9. The manufacturing system of claim 8, further comprising a first set of electrical, gas, and water systems located adjacent the first annealing system; and a second set of electrical, gas, and water systems located adjacent the second annealing system.

10. The manufacturing system of claim 8, further comprising a first service area located adjacent a first edge of the first and second annealing systems for access to the first annealing system and a second service area located adjacent a second edge of the first and second annealing systems for access to the second annealing system.

11. The manufacturing system of claim 1, further comprising:
   a third annealing system positioned on a fabrication floor, comprising:
      a vertical furnace having a processing space;
      a workpiece boat to carry at least one hundred workpieces;
      a boat loader arranged beneath the vertical furnace and configured to vertically translate the workpiece boat and position the workpieces within the processing space; and
      a magnet positioned outside the vertical furnace and configured to generate a magnetic field within the processing space; and
   a fourth annealing system positioned on the fabrication floor, comprising:
      a vertical furnace having a processing space;
      a workpiece boat to carry at least one hundred workpieces;
      a boat loader arranged beneath the vertical furnace and configured to vertically translate the workpiece boat and position the workpieces within the processing space; and
      a magnet positioned outside the vertical furnace and configured to generate a magnetic field within the processing space;
   wherein the third and fourth annealing systems are positioned on the fabrication floor to have a combined footprint of less than 9.5 m² (square meters).

12. The manufacturing system of claim 1, wherein the vertical furnace for the first annealing system and the vertical furnace for the second annealing system each comprises an inner cylindrical insulating tube and at least one heating element surrounding an outer surface thereof, the inner cylindrical insulating tube defining the processing space.

13. The manufacturing system of claim 12, wherein the at least one heating element for each of the first and second annealing systems is configured to elevate a temperature of the plurality of workpieces to a peak temperature ranging up to about 600 degrees Celsius.

14. The manufacturing system of claim 1, further comprising a first workpiece handling robot configured to load and unload two workpieces at a time into and out of the workpiece boat for the first annealing system; and a second workpiece handling robot configured to load and unload two workpieces at a time into and out of the workpiece boat for the second annealing system.

15. The manufacturing system of claim 14, wherein the workpiece handling robot for each of the first and second annealing systems is configured to load two workpieces at a time into the workpiece boat.

16. The manufacturing system of claim 14, wherein the workpiece handling robot for each of the first and second annealing systems is configured to unload two workpieces at a time out of the workpiece boat.

17. The manufacturing system of claim 1, wherein the magnet systems for the first and second annealing systems each comprises at least one of a superconducting magnet, an electromagnet, a permanent magnet, a solenoid magnet, or a Helmholtz magnet.

18. The manufacturing system of claim 1, wherein the first and second annealing systems each further comprises a workpiece boat turntable arranged beneath the vertical furnace and configured to support at least two workpiece boats and to index the at least two workpiece boats between a process position and a load/unload position.

19. The manufacturing system of claim 1, wherein the boat loader for each of the first and second annealing systems comprises:
   a loading arm oriented vertically and characterized by a length ($L_a$) that is sufficiently long to locate the workpiece boat within the vertical furnace;
   a platform located at a distal end of the loading arm and configured to engage and to support the workpiece boat when loading and unloading the workpiece boat to and from the vertical furnace; and
   a drive system located at an opposing distal end of the loading arm and configured to vertically translate the workpiece boat.

20. The manufacturing system of claim 19, wherein the loading arm for each of the first and second annealing systems is a retractable loading arm.

21. A method to anneal multiple batches of workpieces, comprising:
   loading at least one hundred workpieces into a first workpiece boat for a first annealing system positioned on a fabrication floor, the first annealing system further comprising:
      a vertical furnace having a processing space;
      a boat loader arranged beneath the vertical furnace and configured to vertically translate the workpiece boat and position the workpieces within the processing space; and
      a magnet positioned outside the vertical furnace and configured to generate a magnetic field within the processing space;

loading at least one hundred workpieces into a second workpiece boat for a second annealing system positioned on a fabrication floor, the second annealing system further comprising:
  a vertical furnace having a processing space;
  a boat loader arranged beneath the vertical furnace and configured to vertically translate the workpiece boat and position the workpieces within the processing space; and
  a magnet positioned outside the vertical furnace and configured to generate a magnetic field within the processing space;
vertically translating the first and second workpieces into the processing spaces of the vertical furnaces using the boat loaders for the first and second annealing systems;
elevating temperatures for the least one hundred workpieces loaded into the first workpiece boat and for the least one hundred workpieces loaded into the second workpiece boat; and
generating magnetic fields within the processing space for the first annealing system using the magnet for the first annealing system and within the processing space for the second annealing system using the magnet system for the second annealing system;
wherein the first and second annealing systems are positioned on the fabrication floor to have a combined footprint of less than 9.5 m² (square meters).

22. The method of claim 21, wherein the magnet for the first annealing system and the magnet for the second annealing system each comprises a vertical passive magnet.

23. The method of claim 21, wherein the first and second annealing systems are further configured to have a combined vertical footprint less than a height limit of between 3.5 meters to 4.2 meters.

24. The method of claim 21, wherein the magnet for the first annealing system and the magnet for the second annealing system each has a magnetic field that decreases to 5-Gauss within a distance (X) from a middle vertical axis of the magnet where 0.4 meters≤X≤1.1 meters.

25. The method of claim 24, wherein the magnet for the first annealing system and the magnet for the second annealing system each provides a magnetic field up to a level (M) within the processing space for each annealing system where M≥1 Tesla.

26. The method of claim 25, wherein a 5-Gauss field line associated with the second annealing system either does not overlap with a 5-Gauss field line associated with the first annealing system or overlaps with the 5-Gauss field line associated with the first annealing system by less than or equal to 10 percent of the distance (X).

27. The method of claim 25, wherein a 5-Gauss field line associated with the second annealing system either does not overlap with a 5-Gauss field line associated with the first annealing system or overlaps with the 5-Gauss field line associated with the first annealing system by less than or equal to 0.2 percent of the distance (X).

28. The method of claim 21, wherein the first and second annealing systems are positioned in an offset, side-by-side arrangement.

29. The method of claim 28, further comprising accessing the first annealing system to service the first annealing system from a first service area located on a first side of the first and second annealing systems, and accessing the second annealing system to service the second annealing system from a second service area located on a second side of the first and second annealing systems.

30. The method of claim 21, further comprising:
loading at least one hundred workpieces into a third workpiece boat for a third annealing system positioned on a fabrication floor, the third annealing system further comprising:
  a vertical furnace having a processing space;
  a boat loader arranged beneath the vertical furnace and configured to vertically translate the workpiece boat and position the workpieces within the processing space; and
  a magnet positioned outside the vertical furnace and configured to generate a magnetic field within the processing space;
loading at least one hundred workpieces into a fourth workpiece boat for a fourth annealing system positioned on a fabrication floor, the fourth annealing system further comprising:
  a vertical furnace having a processing space;
  a boat loader arranged beneath the vertical furnace and configured to vertically translate the workpiece boat and position the workpieces within the processing space; and
  a magnet positioned outside the vertical furnace and configured to generate a magnetic field within the processing space;
vertically translating the third and fourth workpieces into the processing spaces of the vertical furnaces using the boat loaders for the third and fourth annealing systems;
elevating temperatures for the least one hundred workpieces loaded into the third workpiece boat and for the least one hundred workpieces loaded into the fourth workpiece boat; and
generating magnetic fields within the processing space for the third annealing system using the magnet for the third annealing system and within the processing space for the fourth annealing system using the magnet system for the fourth annealing system;
wherein the third and fourth annealing systems are positioned on the fabrication floor to have a combined footprint of less than 9.5 m² (square meters).

* * * * *

UNITED STATES PATENT AND TRADEMARK OFFICE
CERTIFICATE OF CORRECTION

PATENT NO. : 10,003,018 B1
APPLICATION NO. : 15/589613
DATED : June 19, 2018
INVENTOR(S) : Ian Colgan et al.

It is certified that error appears in the above-identified patent and that said Letters Patent is hereby corrected as shown below:

In the Specification

In Column 3, Line 27, "the magnet systems for" should read ---the magnets for---.

In Column 4, Line 3, "the first and second workpieces" should read ---the first and second workpiece boats---.

In Column 4, Line 12, "the magnet system for" should read ---the magnet for---.

In Column 5, Line 4, "the third and fourth workpieces" should read ---the third and fourth workpiece boats---.

In Column 5, Line 13, "the magnet system for" should read ---the magnet for---.

In Column 6, Lines 14-15, "gas/water/pneumatics distribution," should read ---gas/water/pneumatics distribution systems,---.

In Column 8, Line 40, "length 104, $L_a$," should read ---length $L_a$,---.

In Column 9, Line 1, "10-8" should read ---$10^{-8}$---.

In Column 9, Line 4, "10-3" should read ---$10^{-3}$---.

In Column 9, Line 6, "10-7" should read ---$10^{-7}$---.

In Column 9, Line 55, "vertical furnace 110" should read ---vertical furnace 410---.

In Column 10, Line 53, "120 degrees C." should read ---120 degrees.---.

In Column 12, Line 8, "up to at least 5 T (e.g., $M \geq 1$ T)," should read ---up to at least 5 T Signed and Sealed this
Thirteenth Day of November, 2018

Andrei Iancu
*Director of the United States Patent and Trademark Office*

(e.g., M≥5 T),---.

In Column 13, Line 63, "the annular chamber 415" should read ---the annular channel 415---.

In Column 14, Line 14, "loaded into the first workpiece." should read ---loaded into the first workpiece boat.---.

In the Claims

In Column 18, Lines 25-26, Claim 17, "the magnet systems for" should read ---the magnets for---.

In Column 19, Line 13, Claim 21, "the first and second workpieces" should read ---the first and second workpiece boats---.

In Column 19, Lines 23-24, Claim 21, "the magnet system for" should read ---the magnet for---.

In Column 20, Line 38, Claim 30, "the third and fourth workpieces" should read ---the third and fourth workpiece boats---.

In Column 20, Lines 48-49, "the magnet system for" should read ---the magnet for---.